United States Patent
Chang et al.

(10) Patent No.: US 9,583,641 B1
(45) Date of Patent: Feb. 28, 2017

(54) SEMICONDUCTOR DEVICE AND MANUFACTURING METHOD THEREOF

(71) Applicant: UNITED MICROELECTRONICS CORP., Hsin-Chu (TW)

(72) Inventors: Yuan-Hsiang Chang, Hsinchu (TW); Yi-Shan Chiu, Taoyuan (TW); Chih-Chien Chang, Hsinchu (TW); Jianjun Yang, Singapore (SG); Wen-Chuan Chang, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/960,453

(22) Filed: Dec. 7, 2015

(30) Foreign Application Priority Data

Nov. 11, 2015 (CN) .......................... 2015 1 0764951

(51) Int. Cl.
*H01L 29/792* (2006.01)
*H01L 29/66* (2006.01)
*H01L 29/423* (2006.01)

(52) U.S. Cl.
CPC ..... *H01L 29/7923* (2013.01); *H01L 29/42344* (2013.01); *H01L 29/665* (2013.01); *H01L 29/66545* (2013.01); *H01L 29/66833* (2013.01)

(58) Field of Classification Search
None
See application file for complete search history.

(56) References Cited

U.S. PATENT DOCUMENTS

| | | | |
|---|---|---|---|
| 8,722,493 B2 | 5/2014 | Hall | |
| 8,969,940 B1* | 3/2015 | Yater | H01L 29/42328 257/314 |
| 9,082,837 B2 | 7/2015 | Perera | |
| 2006/0028868 A1* | 2/2006 | Okazaki | G11C 16/0425 365/185.05 |
| 2007/0108504 A1* | 5/2007 | Lee | G11C 16/0483 257/316 |
| 2007/0218633 A1* | 9/2007 | Prinz | B82Y 10/00 438/267 |
| 2015/0349786 A1* | 12/2015 | Erdogan | H03L 7/0807 375/375 |
| 2015/0364478 A1* | 12/2015 | Roy | H01L 27/1157 257/326 |

* cited by examiner

*Primary Examiner* — Charles Garber
*Assistant Examiner* — Alia Sabur
(74) *Attorney, Agent, or Firm* — Winston Hsu; Scott Margo

(57) ABSTRACT

A manufacturing method of a semiconductor device includes the following steps. A plurality of select gates are formed on a memory region of a semiconductor substrate. Two charge storage structures are formed between two adjacent select gates. A source region is formed in the semiconductor substrate, and the source region is formed between the two adjacent select gates. An insulation block is formed between the two charge storage structures and formed on the source region. A memory gate is formed on the insulation block, and the memory gate is connected to the two charge storage structures.

11 Claims, 22 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including one memory gate disposed corresponding to two charge storage structures for increasing the element density and a manufacturing method thereof.

2. Description of the Prior Art

Semiconductor memory devices are used in computer and electronics industries as a means for retaining digital information or data. Typically, the semiconductor memory devices are divided into volatile and non-volatile memory devices depending on whether the data stored in the memory devices is completely lost or not in case of power interruption. The non-volatile memory devices, which can retain their data even when the power supply is interrupted, have been widely employed. As one kind of the non-volatile memory technology, a SONOS memory structure is to build a silicon nitride layer sandwiched between two silicon oxide layers for serving as the charge trap layer while the two silicon oxide layers respectively serve as a charge tunnel layer and a charge block layer. This oxide-nitride-oxide (ONO) multilayered structure is formed between a semiconductor substrate and a silicon floating gate, and thus a SONOS memory structure is constructed.

Since the microprocessors have become more powerful, requirement to memory devices of large-capacity and low-cost is raised. To satisfy such trend and achieve challenge of high integration in semiconductor devices, memory miniaturization is kept on going, and thus fabrication process of memory structure is getting complicated. Therefore, it is always a target for the related industries to effectively enhance integrity and electrical performances by modifying the designs.

SUMMARY OF THE INVENTION

A semiconductor device and a manufacturing method thereof are provided in the present invention. A memory gate is disposed overlapping a source region, the memory gate and the source region are electrically insulated from each other, and the memory is connected to two charge storage structures at the same time for achieving the purposes of shrinking the device size and enhancing the device integrity.

According to an embodiment of the present invention, a manufacturing method of a semiconductor device is provided. The manufacturing method includes the following steps. A plurality of select gates are formed on a memory region of a semiconductor substrate. Two charge storage structures are formed between two adjacent select gates. A source region is formed in the semiconductor substrate, and the source region is formed between the two adjacent select gates. An insulation block is formed between the two charge storage structures and formed on the source region. A memory gate is formed on the insulation block, and the memory gate is connected to the two charge storage structures.

According to an embodiment of the present invention, a semiconductor device is provided. The semiconductor device includes a semiconductor substrate, a plurality of select gates, two charge storage structures, a source region, an insulation block, and a memory gate. The semiconductor substrate has a memory region. The select gates are disposed on the memory region of the semiconductor substrate. The two charge storage structures are disposed between two adjacent select gates. The source region is disposed in the semiconductor substrate, and the source region is disposed between the two adjacent select gates. The insulation block is disposed on the source region, and the insulation block is disposed between the two charge storage structures. The memory gate is disposed on the insulation block, and the memory gate is connected to the two charge storage structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-17 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, FIG. 13 is a schematic drawing in a step subsequent to FIG. 12, FIG. 14 is a schematic drawing in a step subsequent to FIG. 13, FIG. 15 is a schematic drawing in a step subsequent to FIG. 14, FIG. 16 is a schematic drawing in a step subsequent to FIG. 15, and FIG. 17 is a schematic drawing in a step subsequent to FIG. 16.

DETAILED DESCRIPTION

Figure 1:
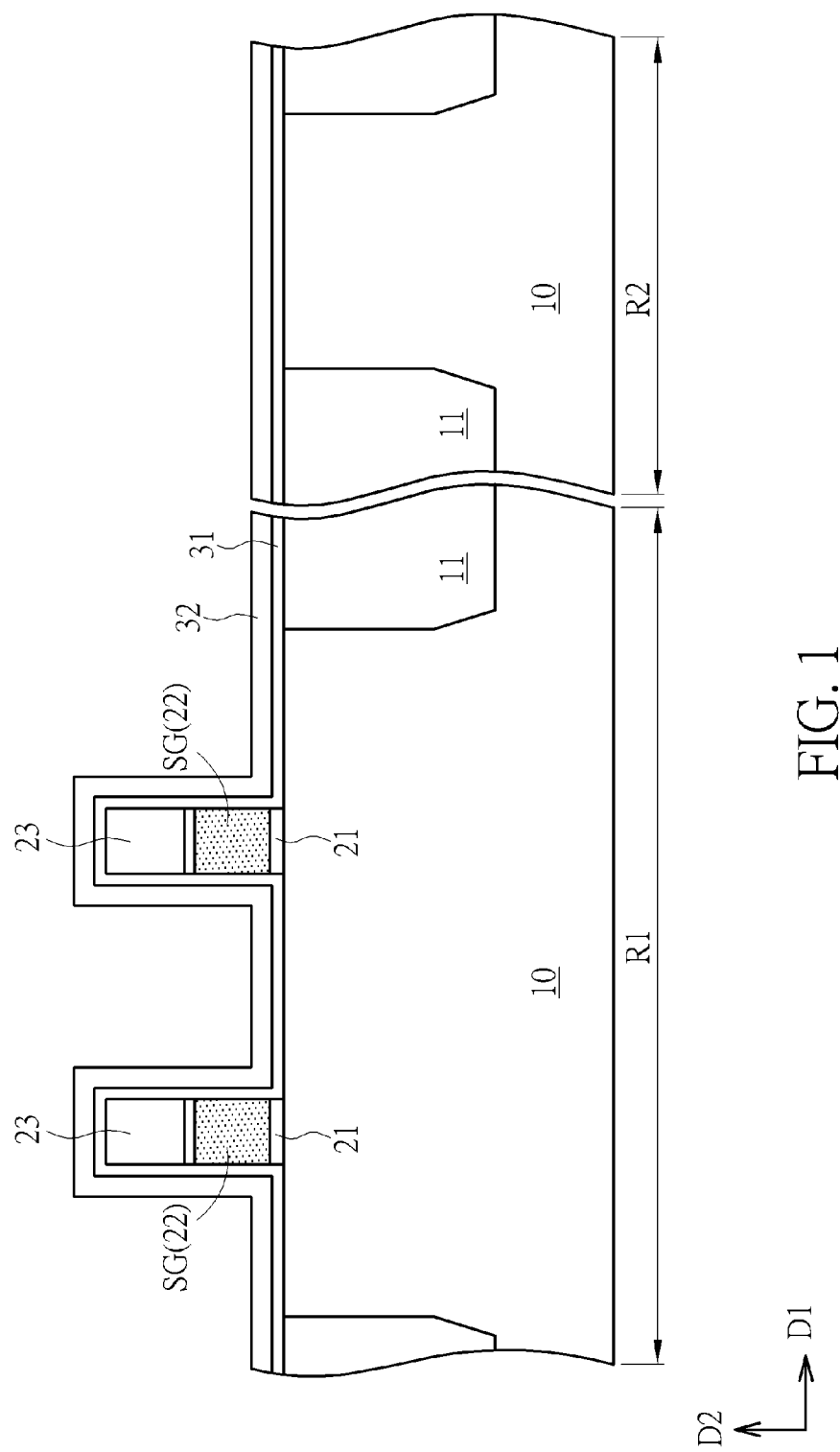

Please refer to FIGS. 1-17. FIGS. 1-17 are schematic drawings illustrating a manufacturing method of a semiconductor device according to a first embodiment of the present invention. The manufacturing method of the semiconductor device in this embodiment includes the following steps. First of all, as shown in FIG. 1, a plurality of select gates SG are formed on a memory region R1 of a semiconductor substrate 10. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. Additionally, the semiconductor substrate 10 may include a logic region R2 and the memory region R1 mentioned above for forming logic units and memory units thereon respectively. The memory region R1 and the logic region R2 may be separated by a shallow trench isolation (STI) 11 formed in the semiconductor substrate 10. The select gate SG in this embodiment may be formed by a polysilicon material 22. Specifically, agate insulation layer 21 and the polysilicon material 22 may be sequentially formed on the semiconductor substrate 10 first, and a first mask 23 is then used in a patterning process performed to the polysilicon material 22 and the gate insulation layer 21 for forming the select gate SG, but the present invention is not limited to this. In other embodiments of the present invention, the select gate SG may also be formed by other conductive materials and/or other manufacturing methods according to other considerations.

Figure 2:
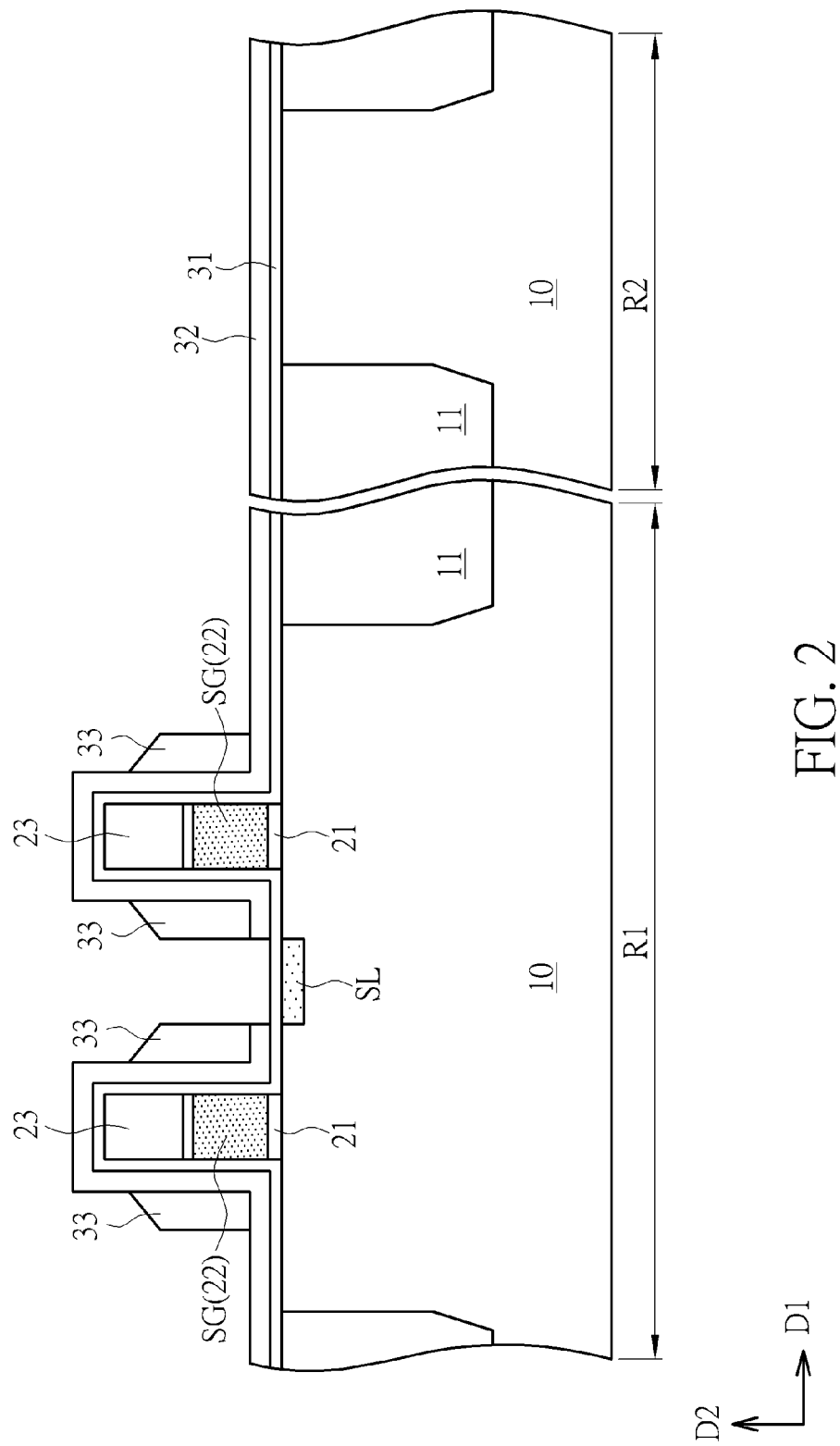
Figure 3:
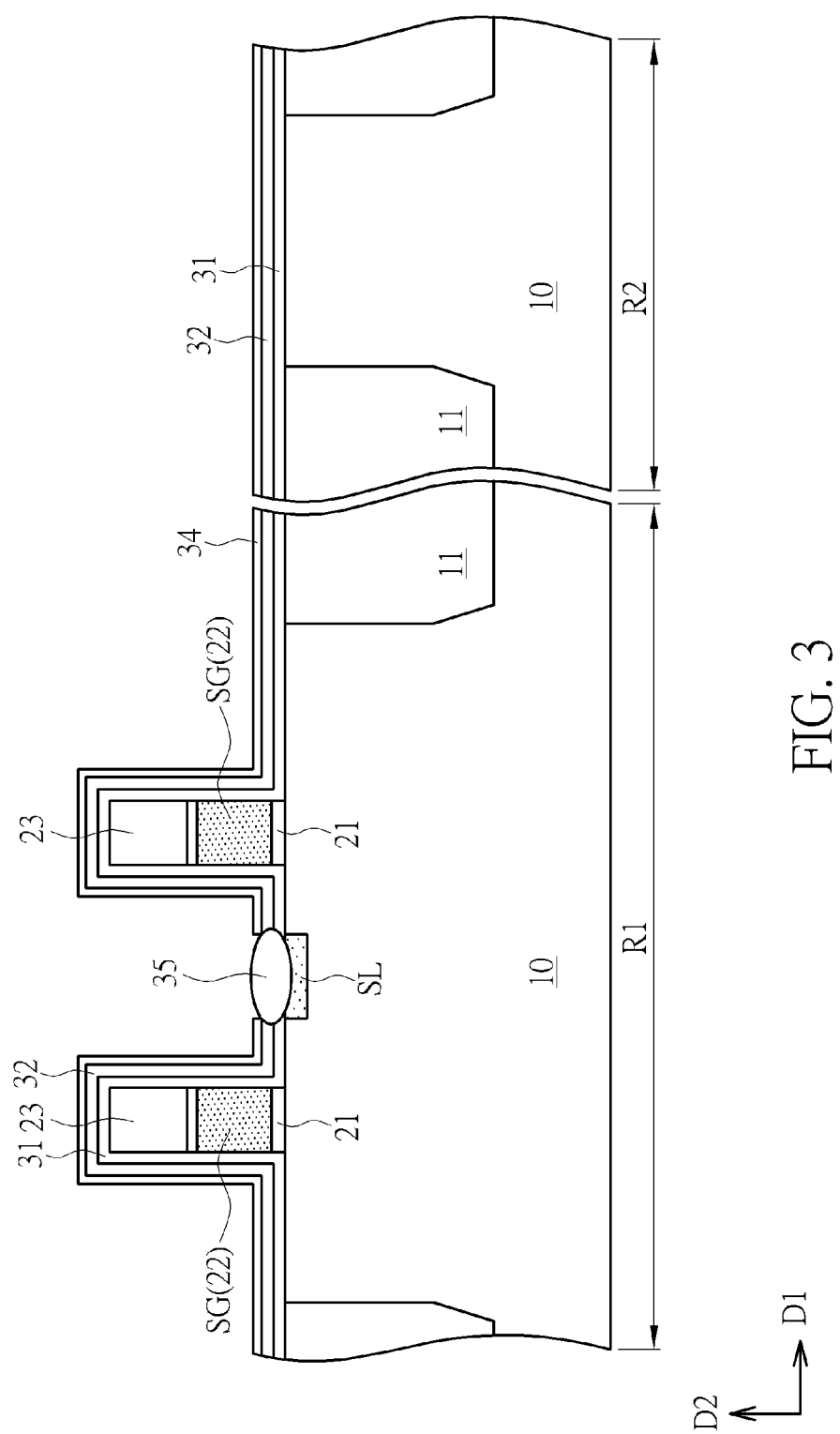

As shown in FIGS. 1-4, two charge storage structures 39 are then formed between two adjacent select gates SG in a horizontal direction D1. The manufacturing approach of the charge storage structures 39 in this embodiment may include but is not limited to the following steps. As shown in FIG. 1, a first oxide layer 31 and a nitride layer 32 are conformally formed. The first oxide layer 31 is formed conformally on the semiconductor substrate 10, the select gates SG, and the first mask 23. The nitride layer 32 is formed conformally on the first oxide layer 31. As shown in FIG. 2, a first sidewall spacer 33 is then formed on the sidewall of each select gate SG. A mask (not shown) is applied to remove a part of the nitride layer 32 located between the two adjacent select gate SG and between the two adjacent first sidewall spacer 33, and a process such as an ion implantation process is performed to form a source region SL in the semiconductor substrate 10. The mask mentioned above may be removed after the source region SL is formed. The source region SL may include a source line or other shapes of the source regions. The source region SL is formed between the two adjacent select gates SG, and the source region SL may be formed corresponding to a region uncovered by the nitride layer 32 and located between the two adjacent select gates SG, but not limited thereto. Subsequently, as shown in FIG. 2 and FIG. 3, the first oxide layer 31 on the source region SL and the first sidewall spacer 33 are removed, and an oxidation process is then performed to form a second oxide layer 34 and an insulation block 35. The second oxide layer 34 is formed conformally on the nitride layer 32, and the insulation block 35 is formed on the source region SL and between the two charge storage structures. In the oxidation process mentioned above, the material of the exposed source region SL and the material of the exposed nitride layer 32 are different, the oxidation rate on the source region SL will be higher than that on the nitride layer 32, and the insulation block 35 will be thicker than the second oxide layer 34 accordingly. In other words, the second oxide layer 34 and the insulation block 35 are formed by an identical oxidation process, and the insulation block 35 may be formed self-aligned above the source region SL, but the present invention is not limited to this. In other embodiments of the present invention, the second oxide layer 34 and the insulation block 35 may also be formed by different processes respectively according to other considerations.

Figure 4:
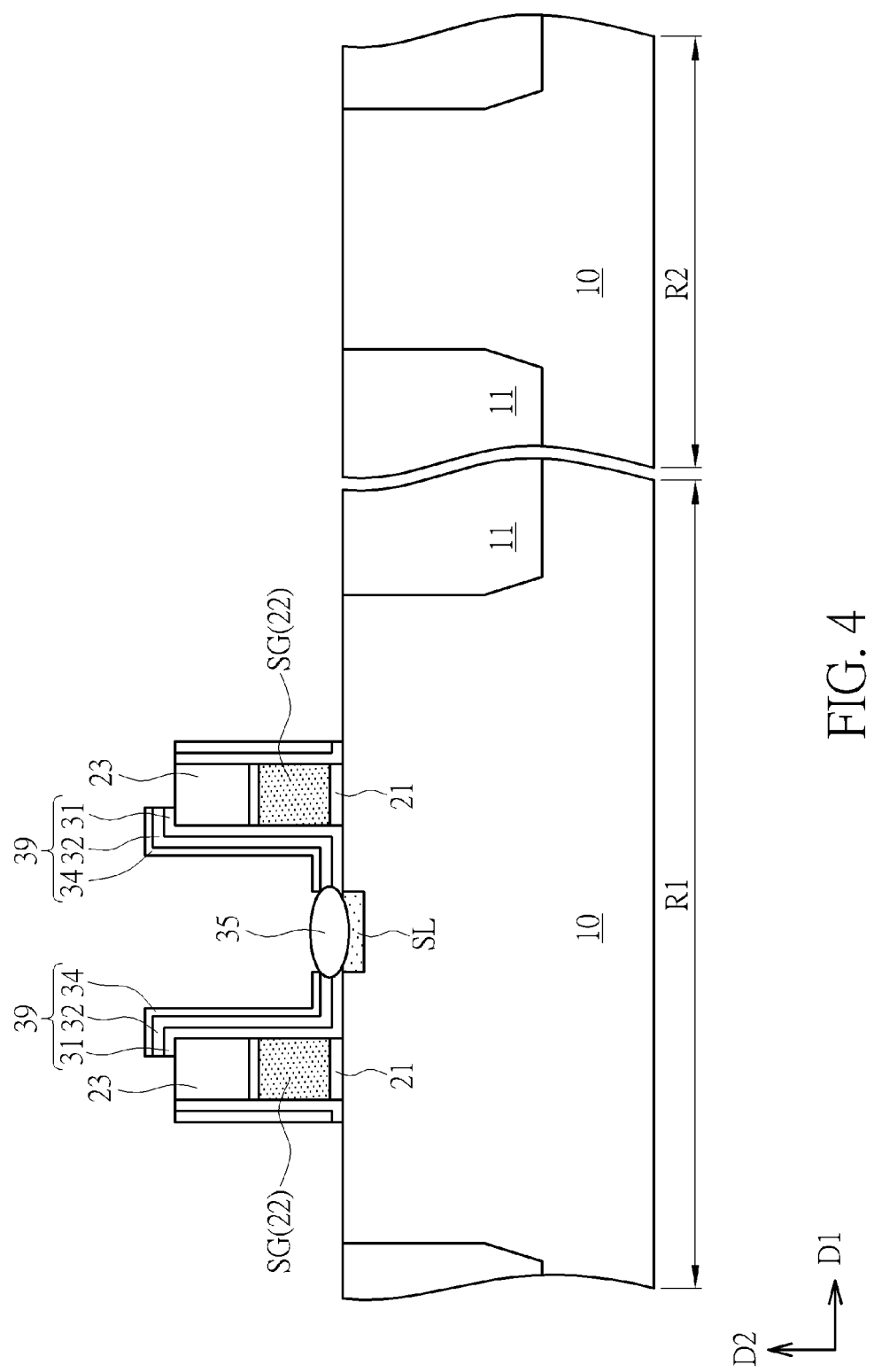

As shown in FIG. 4, a mask (not shown) is applied to remove a part of the first oxide layer 31, a part of the nitride layer 32, and a part of the second oxide layer 34 for forming the two charge storage structures 39 between the two adjacent select gates SG, and the mask is removed after the charge storage structures 39 are formed. Each of the charge storage structures 39 is composed of the remaining part of the first oxide layer 31, the nitride layer 32, and the second oxide layer 34. The two charge storage structures 39 are located at two sides of the insulation block 35 in the horizontal direction D1 respectively, and each of the charge storage structures 39 may partially overlap the first mask 23 in a vertical direction D2 perpendicular to the horizontal direction D1, but not limited thereto. In this embodiment, the first oxide layer 31, the second oxide layer 34, and the insulation block 35 may be silicon oxide, the nitride layer 32 may be silicon nitride, and the charge storage structure 39 may be regarded as an oxide-nitride-oxide (ONO) structure, but not limited thereto. In other embodiments of the present invention, other appropriate materials and/or structures may be applied to form the charge storage structure 39 according to other considerations.

Figure 5:
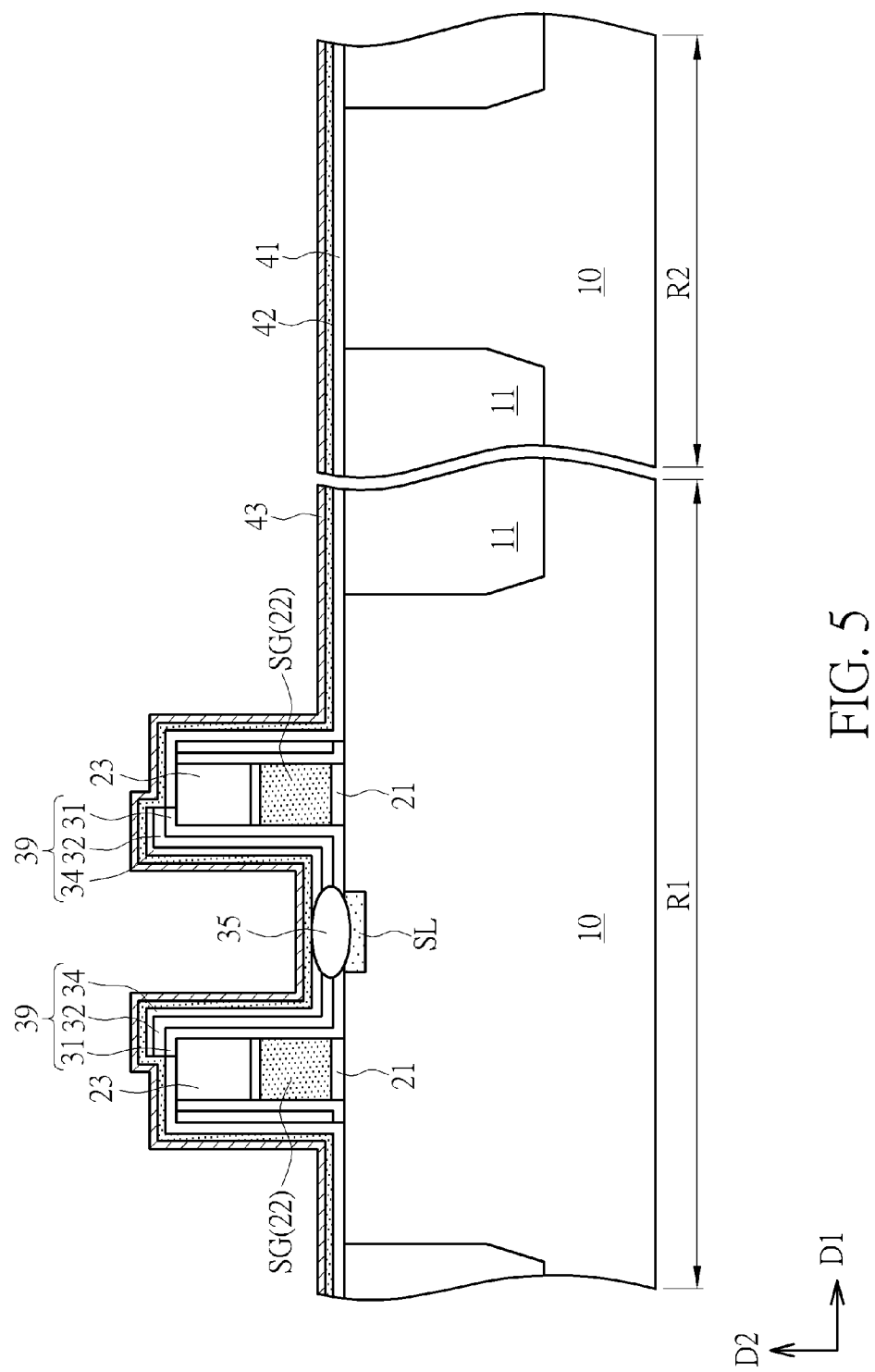

As shown in FIG. 5, an interfacial layer 41, a high dielectric constant (high-k) dielectric layer 42, and a barrier layer 43 are then formed on the logic region R2 and the memory region R1 of the semiconductor substrate 10. The barrier layer 43 is formed on the high-k dielectric layer 42. A part of the high-k dielectric layer 42 and a part of the barrier layer 43 are formed between the two adjacent select gates SG. The high-k dielectric layer 42 may include a material selected from a group containing hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). The barrier layer 43 may include nickel (Ni), titanium (Ti), titanium nitride (TiN), tantalum (Ta), tantalum nitride (TaN), titanium aluminum oxide (TiAlO) or other appropriate material in a single layer or multiple layer structure.

Figure 6:
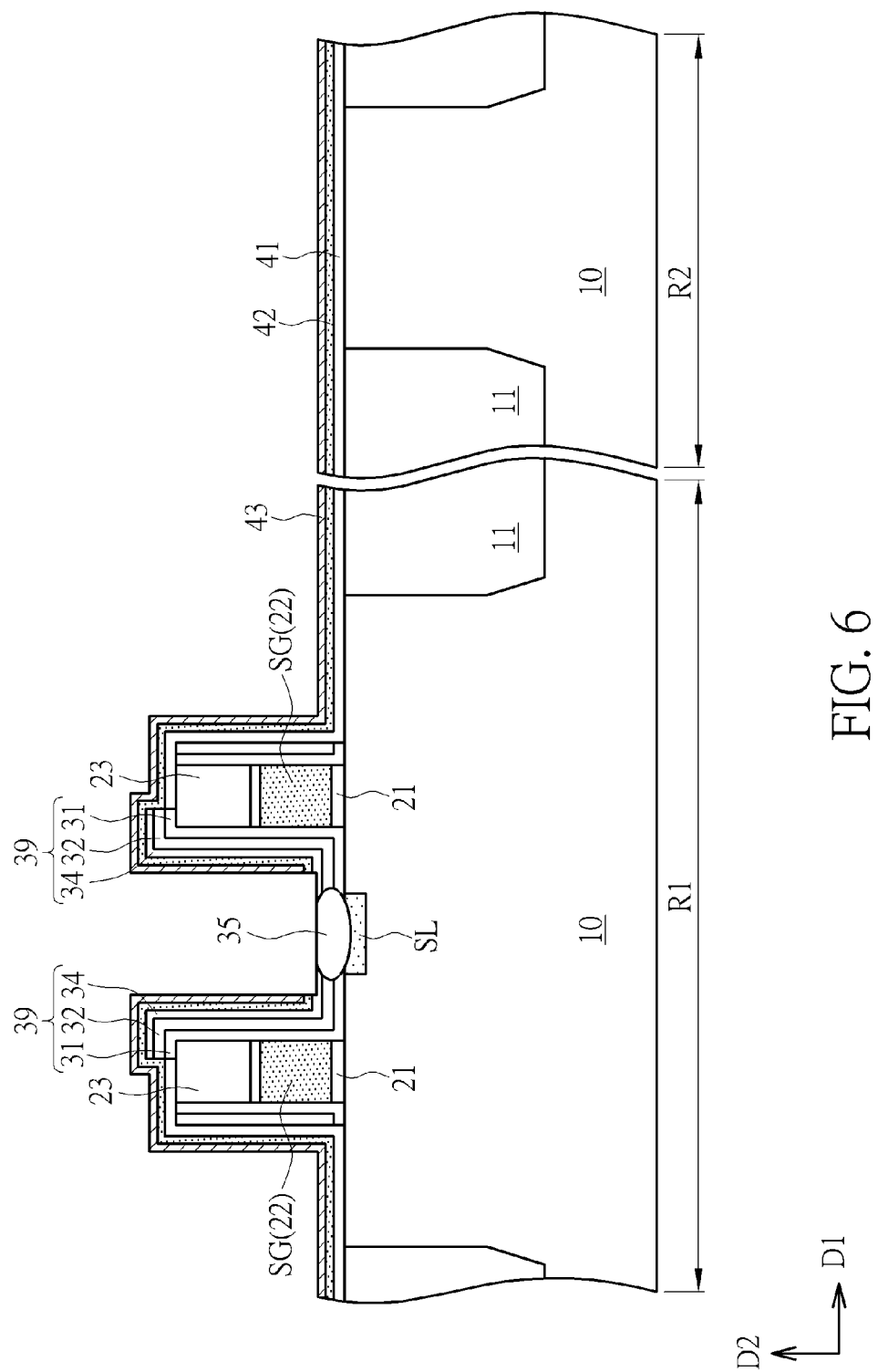
Figure 7:
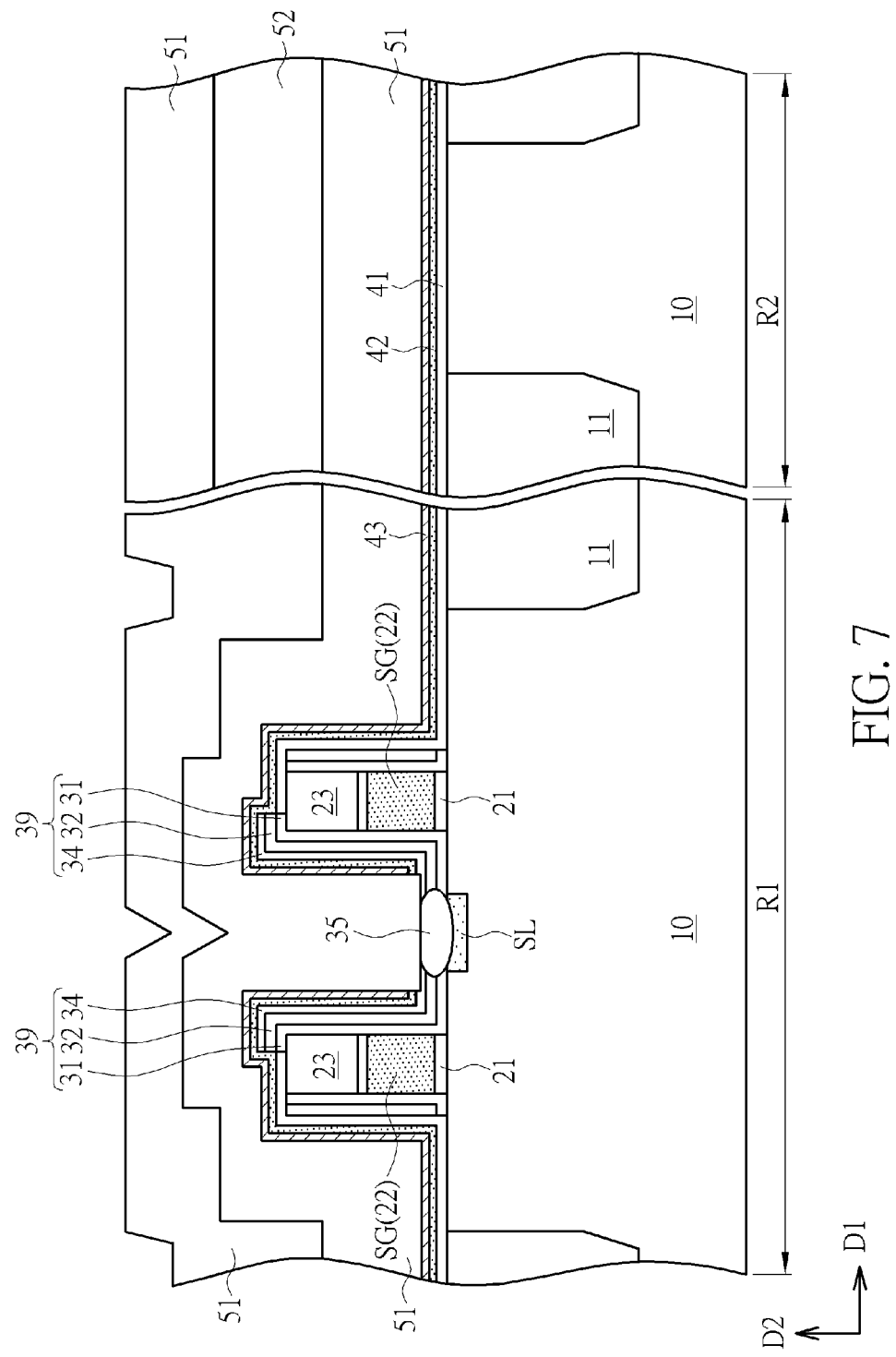
Figure 8:
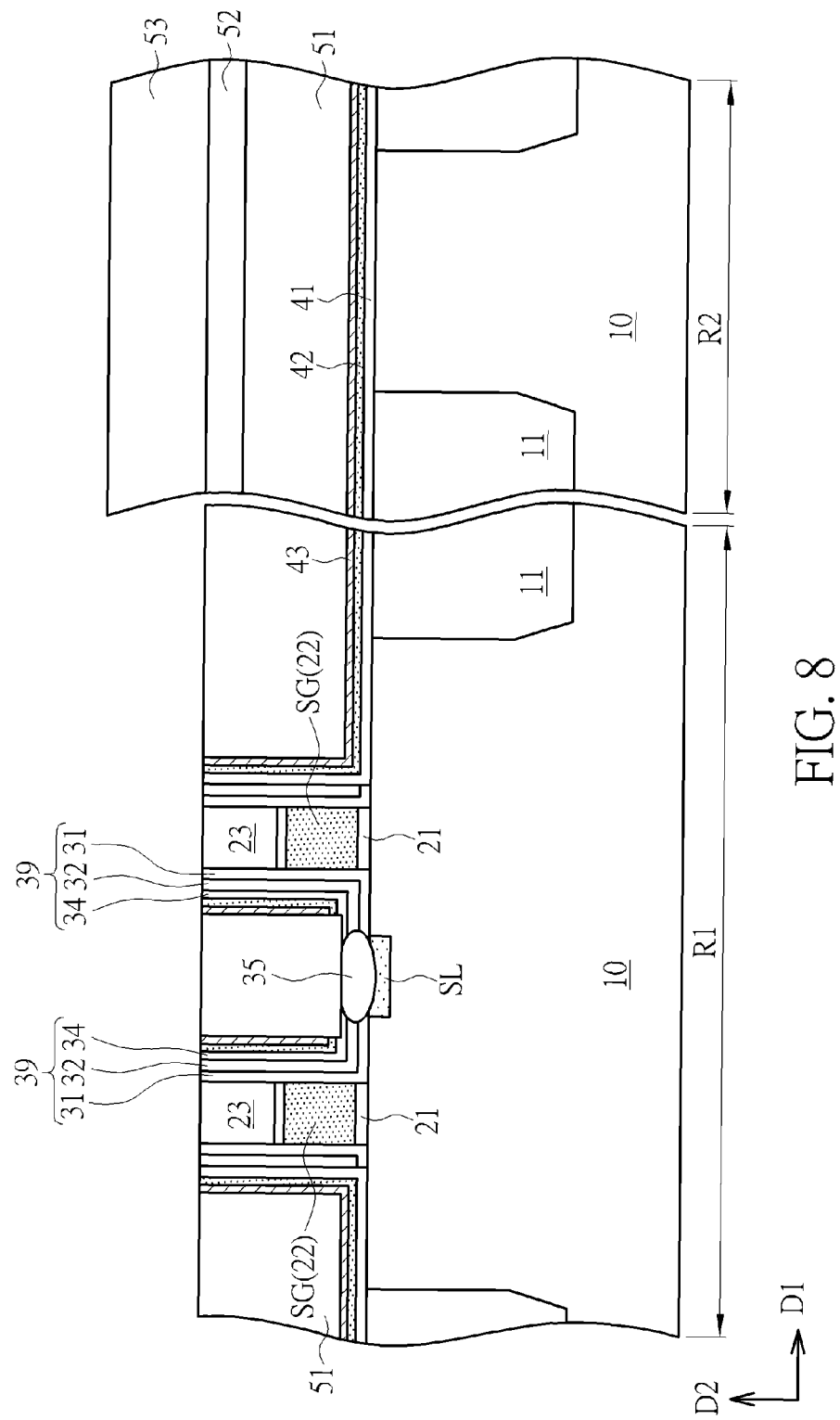
Figure 9:
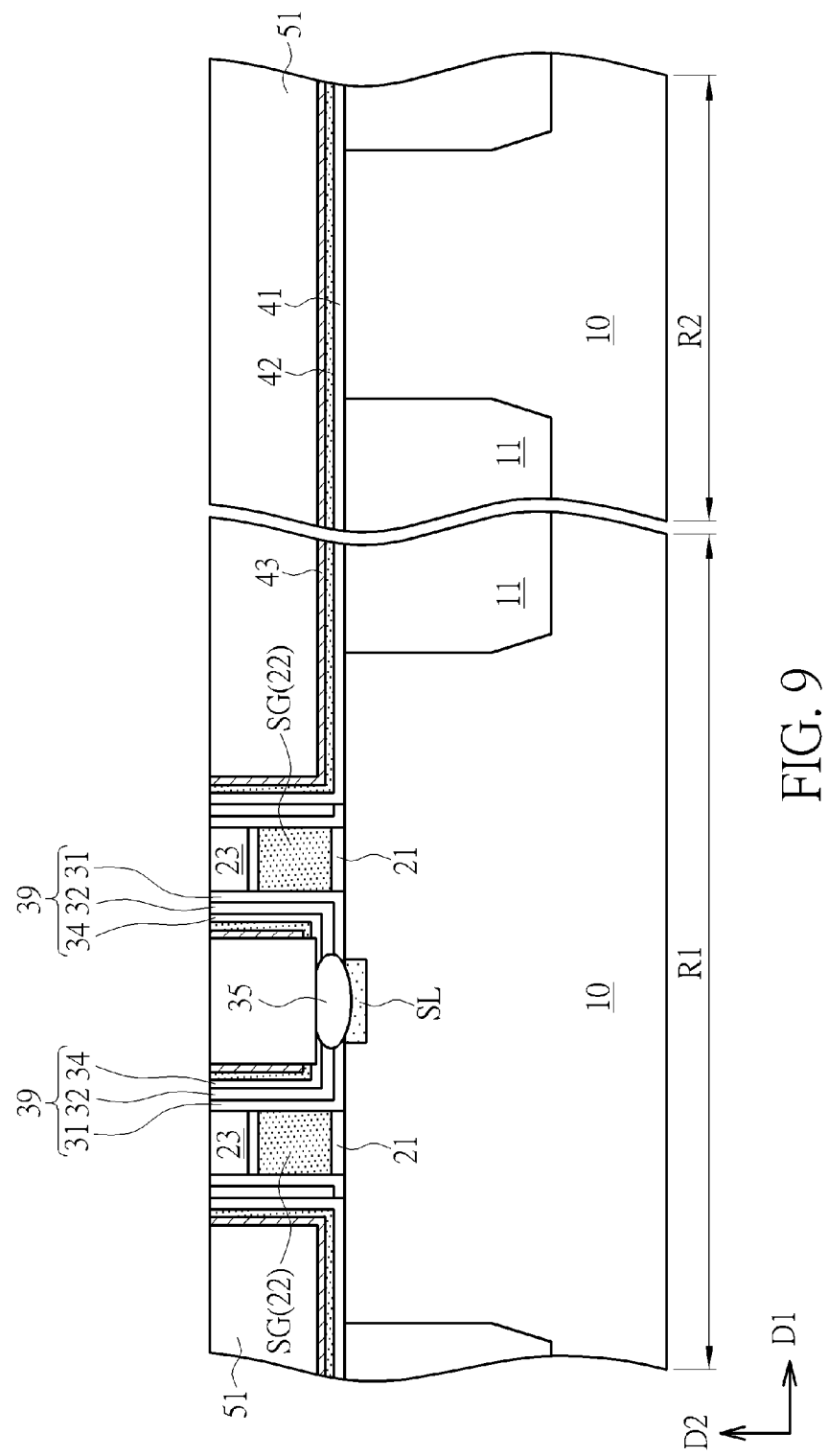

As shown in FIG. 6 and FIG. 7, a mask (not shown) may be used to partially remove the high-k dielectric layer 42 and the barrier layer 43 located above the source region SL and between the two adjacent select gates SG, and a polysilicon layer 51 is then formed on the memory region R1 and the logic region R2 after the mask is removed. The polysilicon layer 51 formed on the logic region R2 may be used to form a dummy gate (not shown in FIG. 6 and FIG. 7) in the subsequent processes, and a part of the polysilicon layer 51 formed on the memory region R1 is used to fill the space between the two adjacent select gates SG for forming a memory gate (not shown in FIG. 6 and FIG. 7, and may also be called a control gate) on the insulation block 35 between the two adjacent select gates SG. Additionally, as shown in FIGS. 7-10, for controlling the height of the polysilicon layer 51 on the memory region R1 and the height of the polysilicon layer 51 on the logic region R2 to be equal, the manufacturing method in this embodiment may include but is not limited to the following steps. First, as shown in FIG. 7, a second mask 52 is formed on the polysilicon layer 51 in the logic region R2, and another polysilicon layer 51 configured to be a sacrifice layer is further formed on the second mask 52 and the polysilicon layer 51 on the memory region R1. As shown in FIG. 8, a planarization process such as a chemical mechanical polish (CMP) process is performed to remove a part of the polysilicon layer 51 and/or the second mask 52, and remove the material layers, such as the charge storage structures 39, the interfacial layer 41, the high-k dielectric layer 42, and/or the barrier layer 43, above the first mask 23 for keeping the top surface of the second mask 52 and the top surface of the polysilicon layer 51 on the memory region R1 substantially at the same level. After the planarization process mentioned above, a third mask 53 is formed on the second mask 52 first, and an etching process with low etching selectivity is then performed (as shown in FIG. 8 and FIG. 9) for making the height of the polysilicon layer 51 on the logic region R2 substantially equal to the height of the polysilicon 51 on the memory region R1. The second mask 52 and the third mask 53 are then removed before the subsequent processes.

Figure 10:
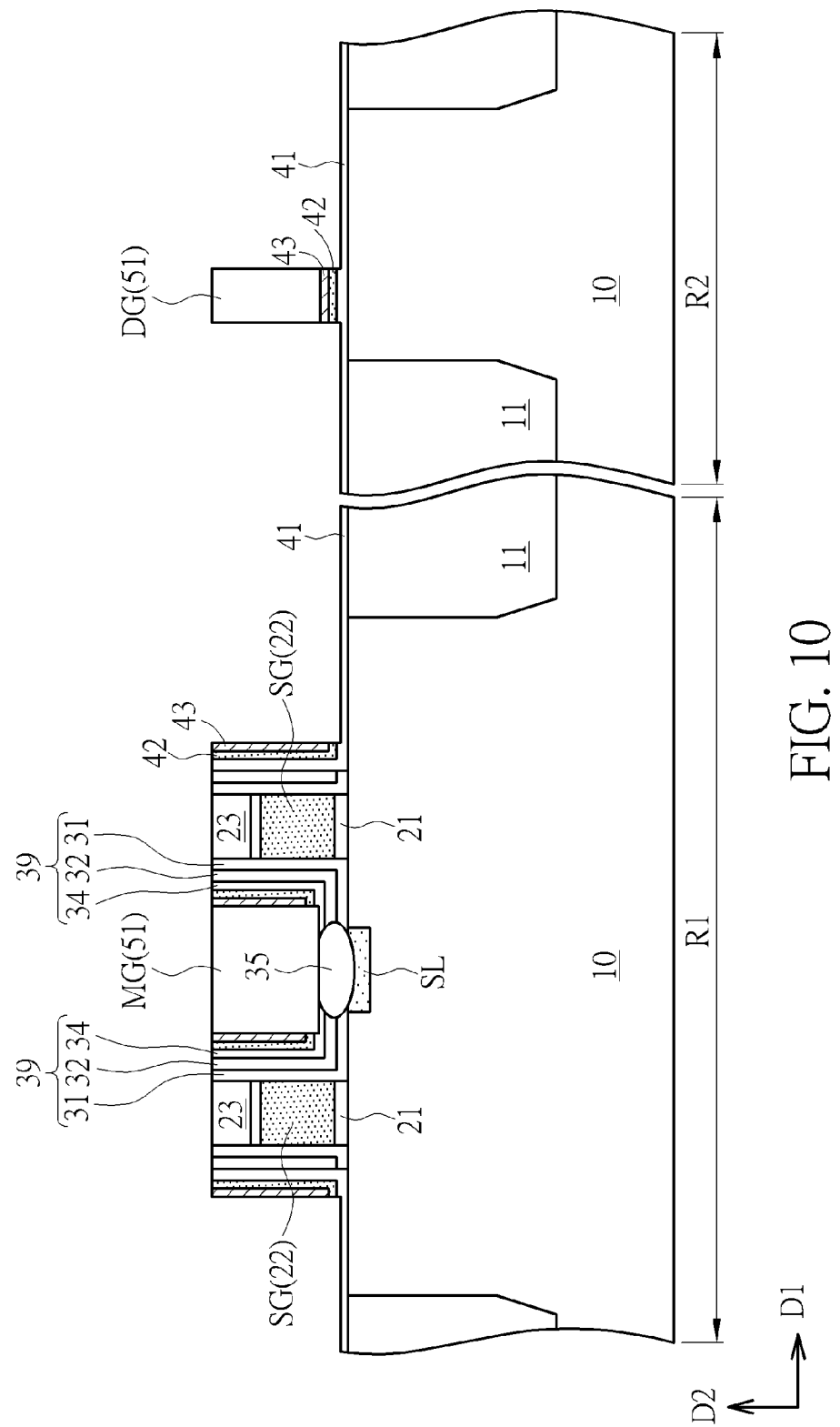

As shown in FIG. 10, a mask (not shown) is used to partially remove the polysilicon layer 51, the high-k dielectric layer 42, and the barrier layer 43 for forming a dummy gate DG on the logic region R2 of the semiconductor substrate 10 and forming a memory gate MG on the memory region R1 of the semiconductor substrate 10, and the mask is then removed. In this embodiment, the dummy gate DG and the memory gate MG are formed by a polysilicon layer (such as the polysilicon layer 51) for the purposes of process integration and process simplification, but not limited thereto. In other embodiments of the present invention, other materials and/or other manufacturing approaches may also be used to form the dummy gate DG and the memory gate MG according to other considerations. The memory gate MG in this embodiment is formed between the two adjacent select gates SG and formed on the insulation block 35. In addition, the memory gate MG is connected to the two charge storage structures 39 between the two adjacent select gates SG. The memory gate MG and the two adjacent select gates SG may be used to control the two charge storage structures 39 respectively. In other words, the memory gate MG and the source region SL may be shared by the two adjacent select gates SG and the corresponding charge storage structures 39 for achieving the purposes of shrinking the size of the device and enhancing the device integrity. Additionally, the cross-sectional shape of the charge storage structure 39 in this embodiment may include a L-shaped structure preferably, and the memory gate MG may overlap the two charge storage structures 39 both in the horizontal direction D1 and in the vertical direction D2, but not limited thereto. In this embodiment, a part of the high-k dielectric layer 42 and a part of the barrier layer 43 are sandwiched between the memory gate MG and the charge storage structure 39 in the horizontal direction D1, but not limited thereto.

Figure 11:
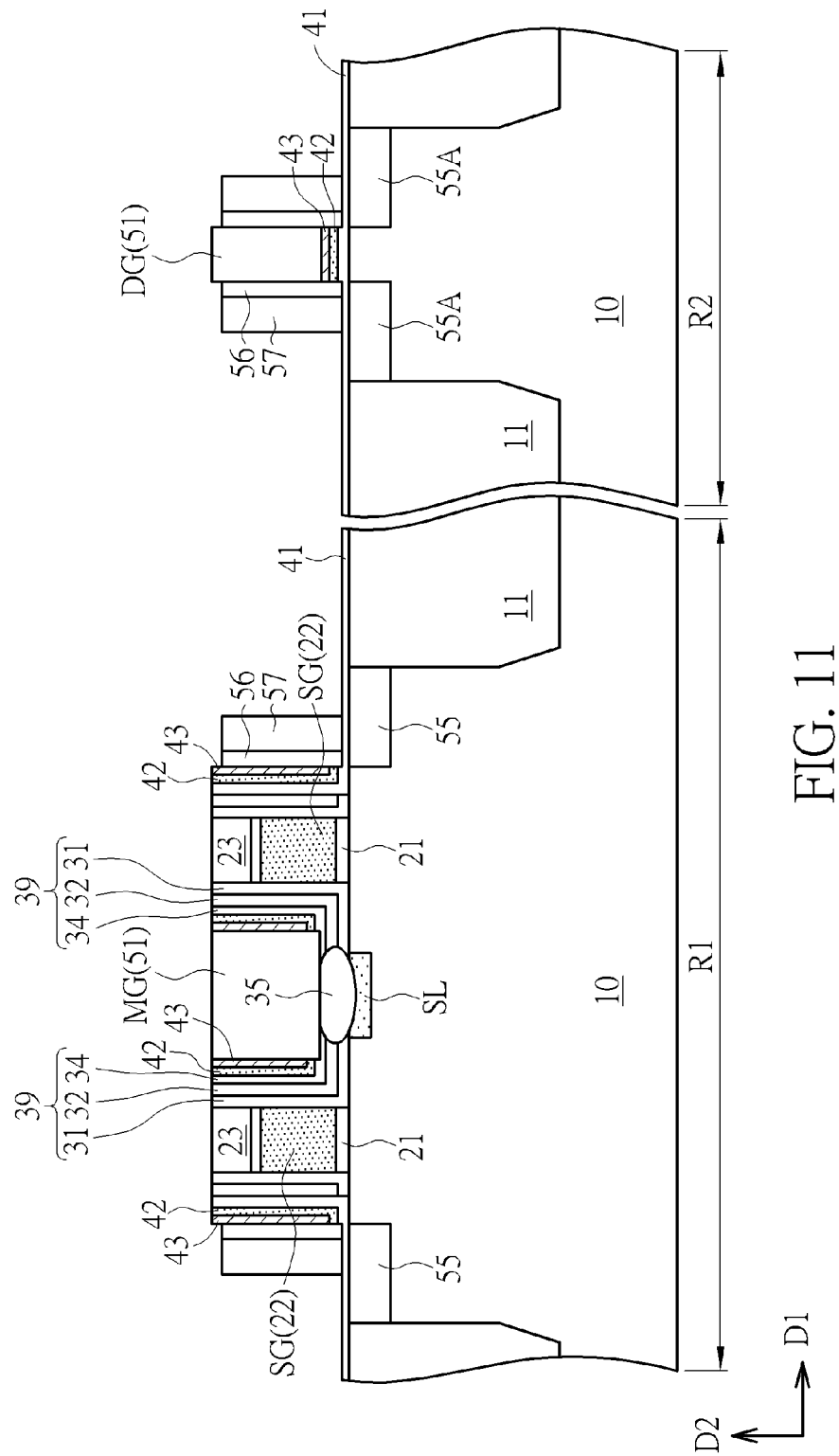
Figure 12:
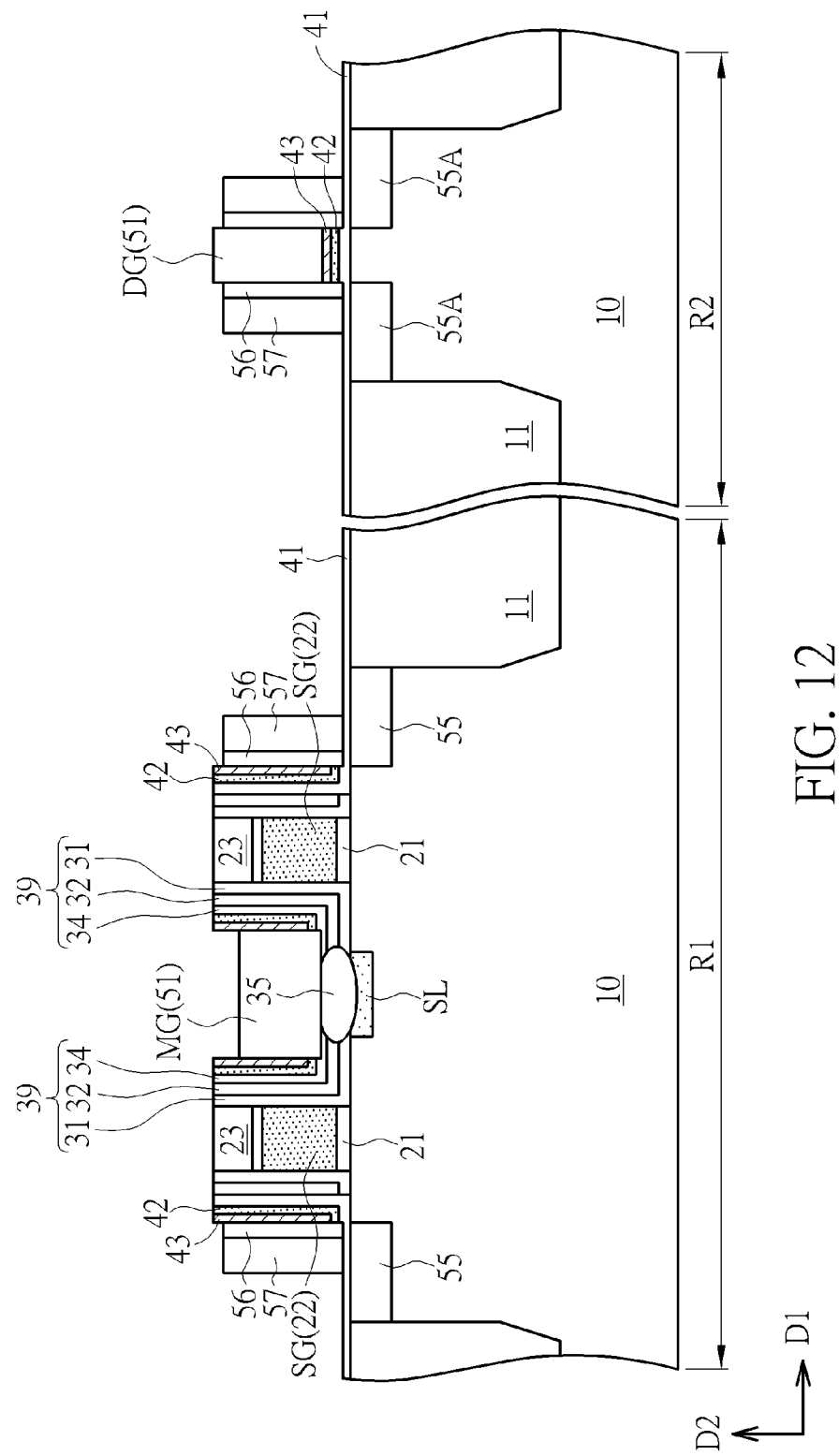
Figure 13:
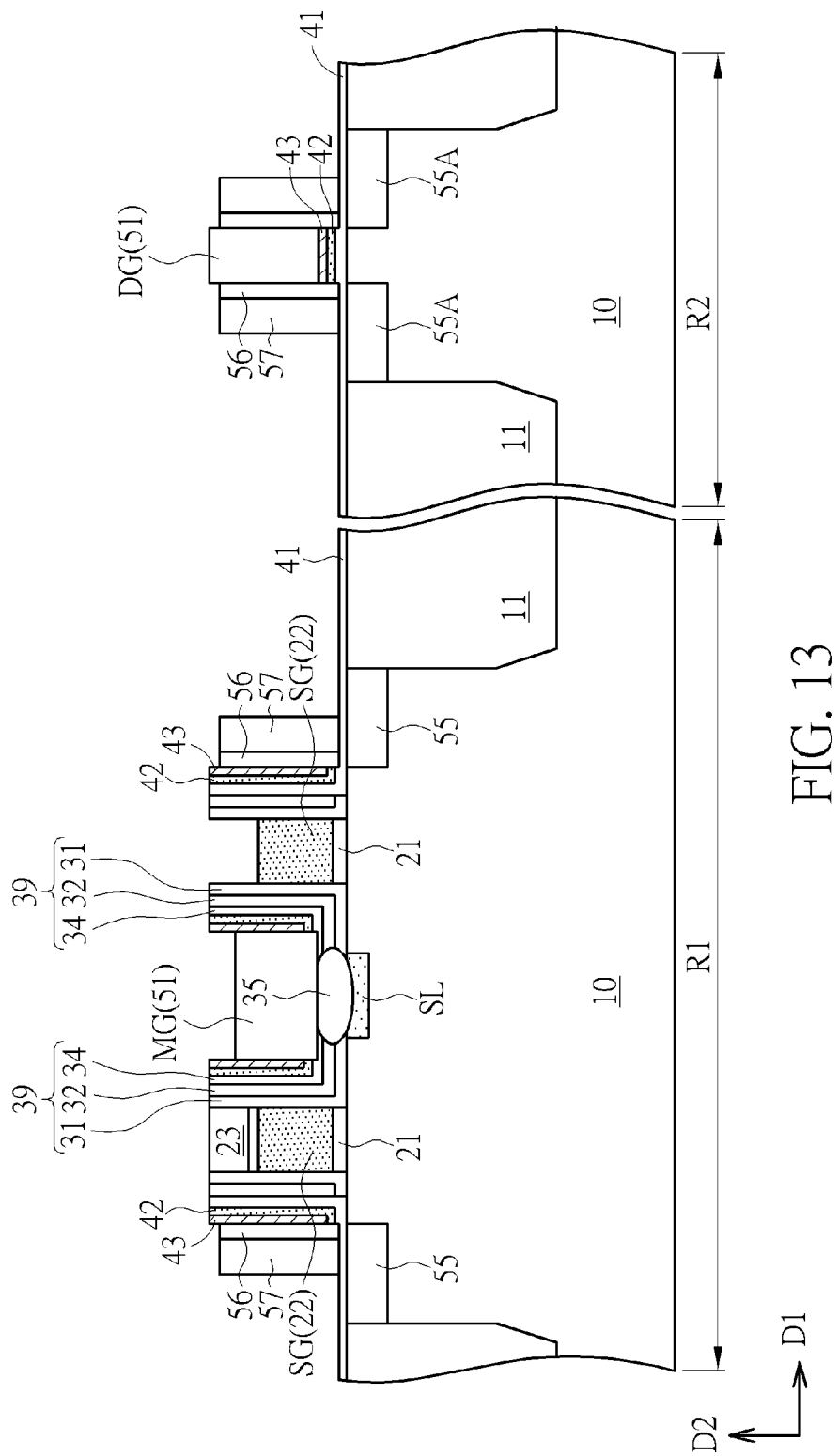
Figure 14:
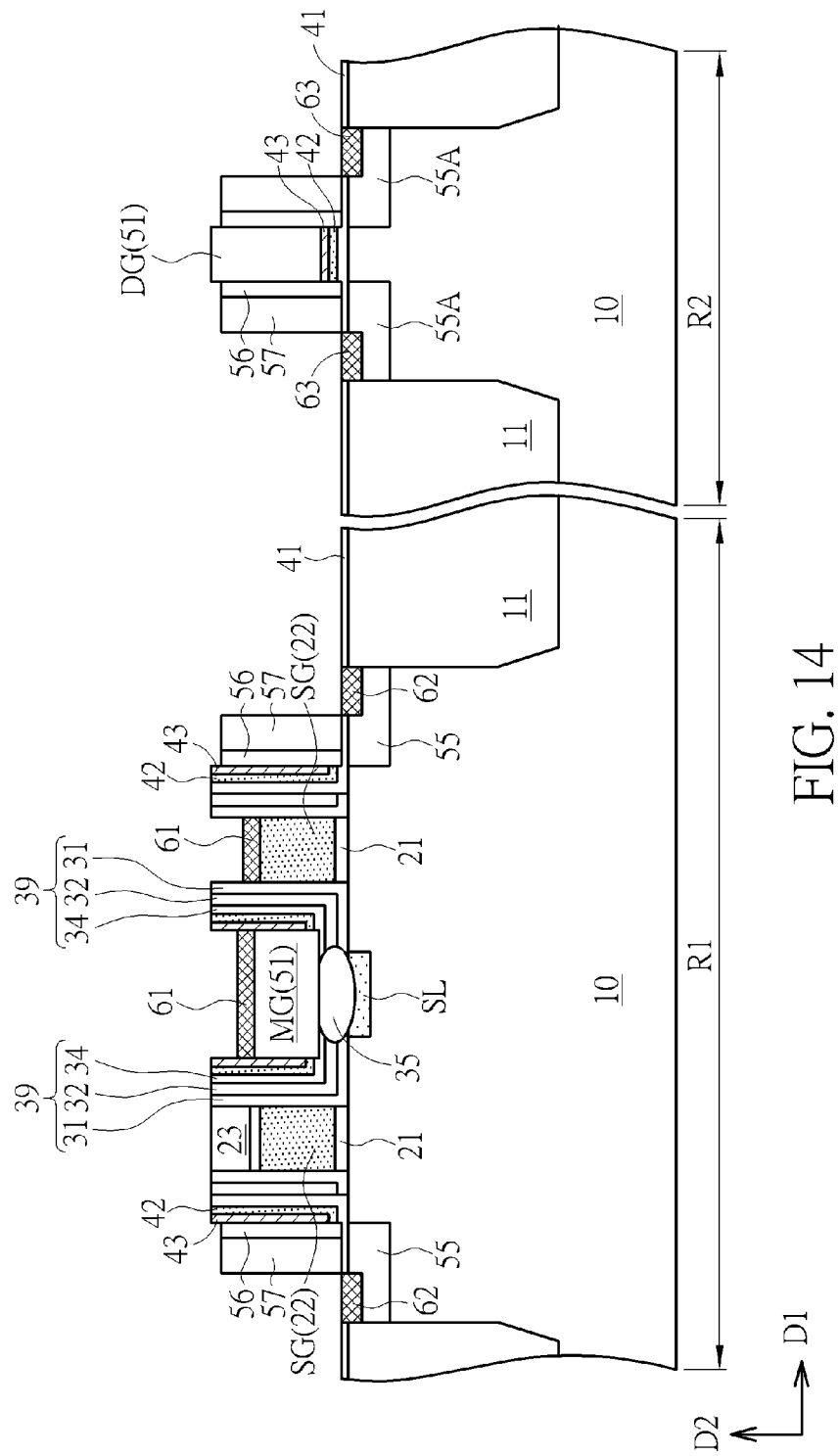

As shown in FIG. 11, the manufacturing method in this embodiment may further include forming lightly doped regions (not shown) and drain regions 55 in the semiconductor substrate 10 at the relatively outer sides of the two select gates SG corresponding to the memory gate MG, and forming lightly doped regions (not shown) and source/drain regions 55A in the semiconductor substrate 10 at two sides of the dummy gate DG. A second sidewall spacer 56 and a third sidewall spacer 57 are then formed on the relatively outer sides of the two select gates SG and the two sides of the dummy gate DG. As shown in FIG. 12, a mask (not shown) is used to perform a recessing process on the memory gate MG for removing a part of the memory gate MG and reducing the height of the memory gate MG, and the mask is then removed after the recessing process. As shown in FIG. 13, the manufacturing method in this embodiment may optionally include removing a part of the select gate SG for lowering the height of the select gate SG in a specific region and defining a region corresponding to a substantially formed contact structure connecting to the select gate SG, but not limited thereto. As shown in FIG. 14, after the recessing process described above, a self-aligned silicide (salicide) 61 is then formed on the memory gate MG and at least a part of the select gates SG respectively. A first silicide 62 is formed in the semiconductor substrate 10 at the relatively outer sides of the two select gates SG corresponding to the memory gate MG, and a second silicide 63 is formed in the semiconductor substrate 10 at the two sides of the dummy gate DG. The self-aligned silicide 61, the first silicide 62, and the second silicide 63 may include a metal silicide respectively and may be formed together, but the present invention is not limited to this. In other embodiments of the present invention, other materials and/or other manufacturing processes may also be applied to form the self-aligned silicide 61, the first silicide 62, and the second silicide 63 according to other considerations.

Figure 15:
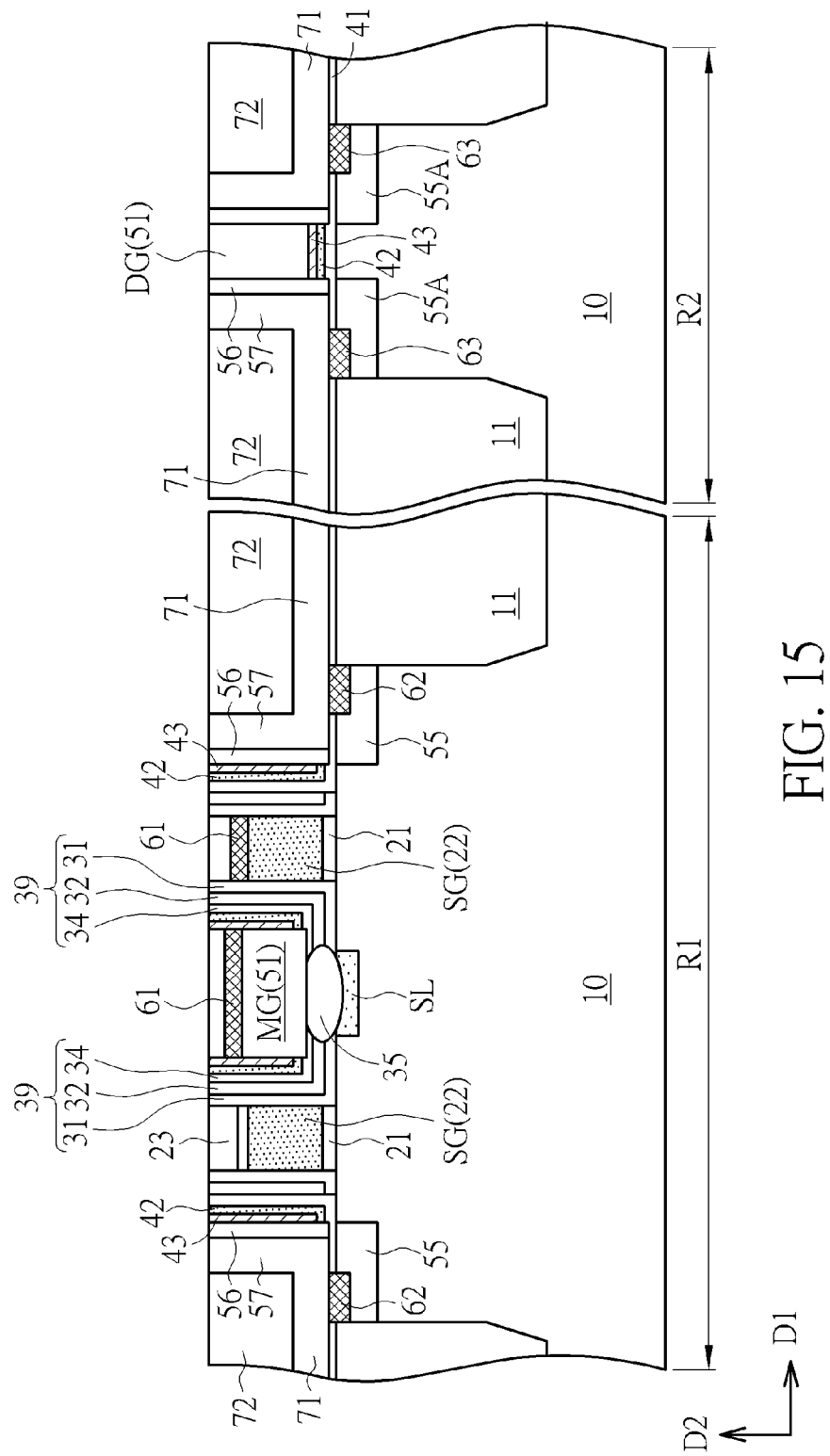
Figure 16:
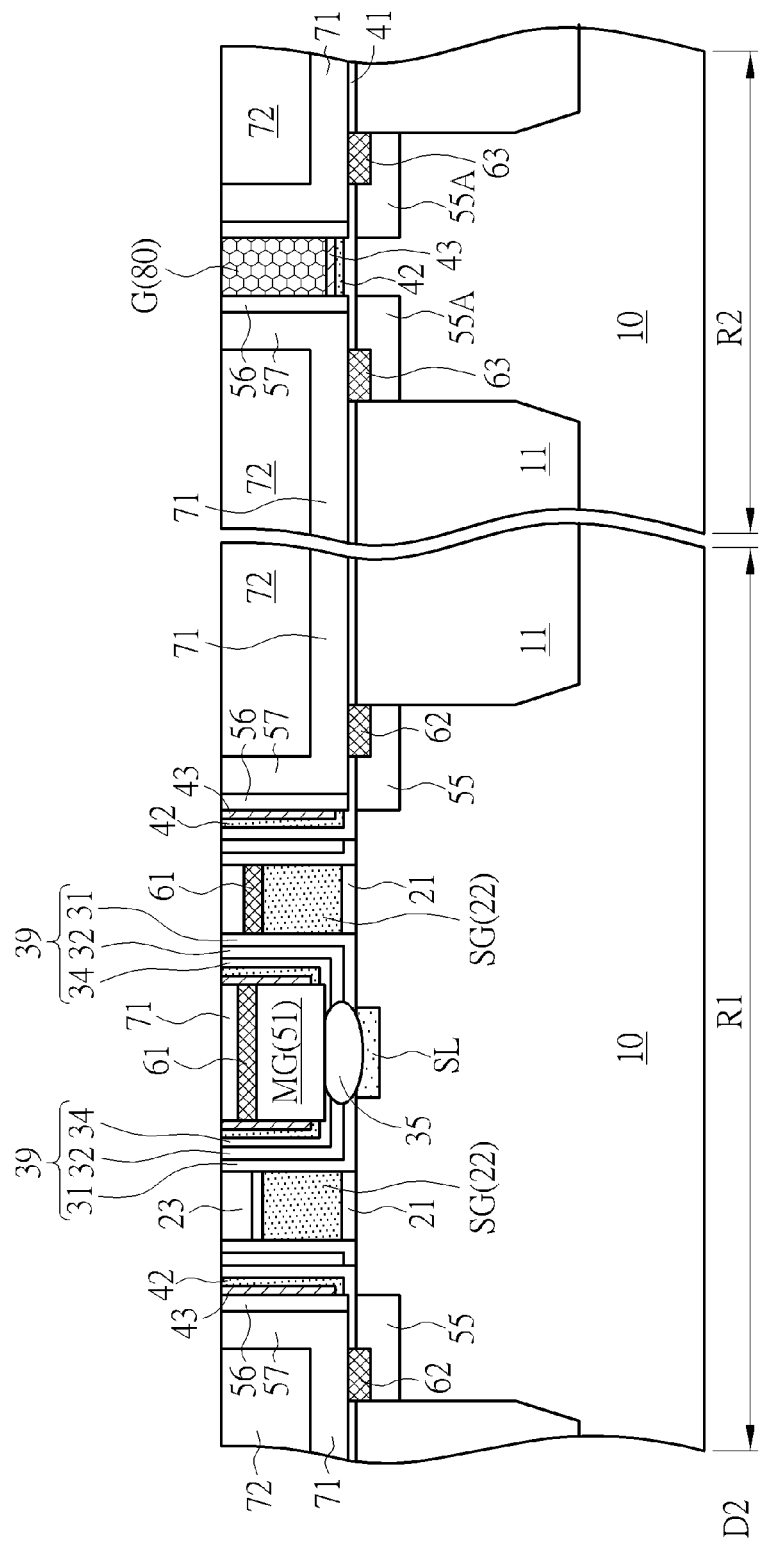
Figure 17:
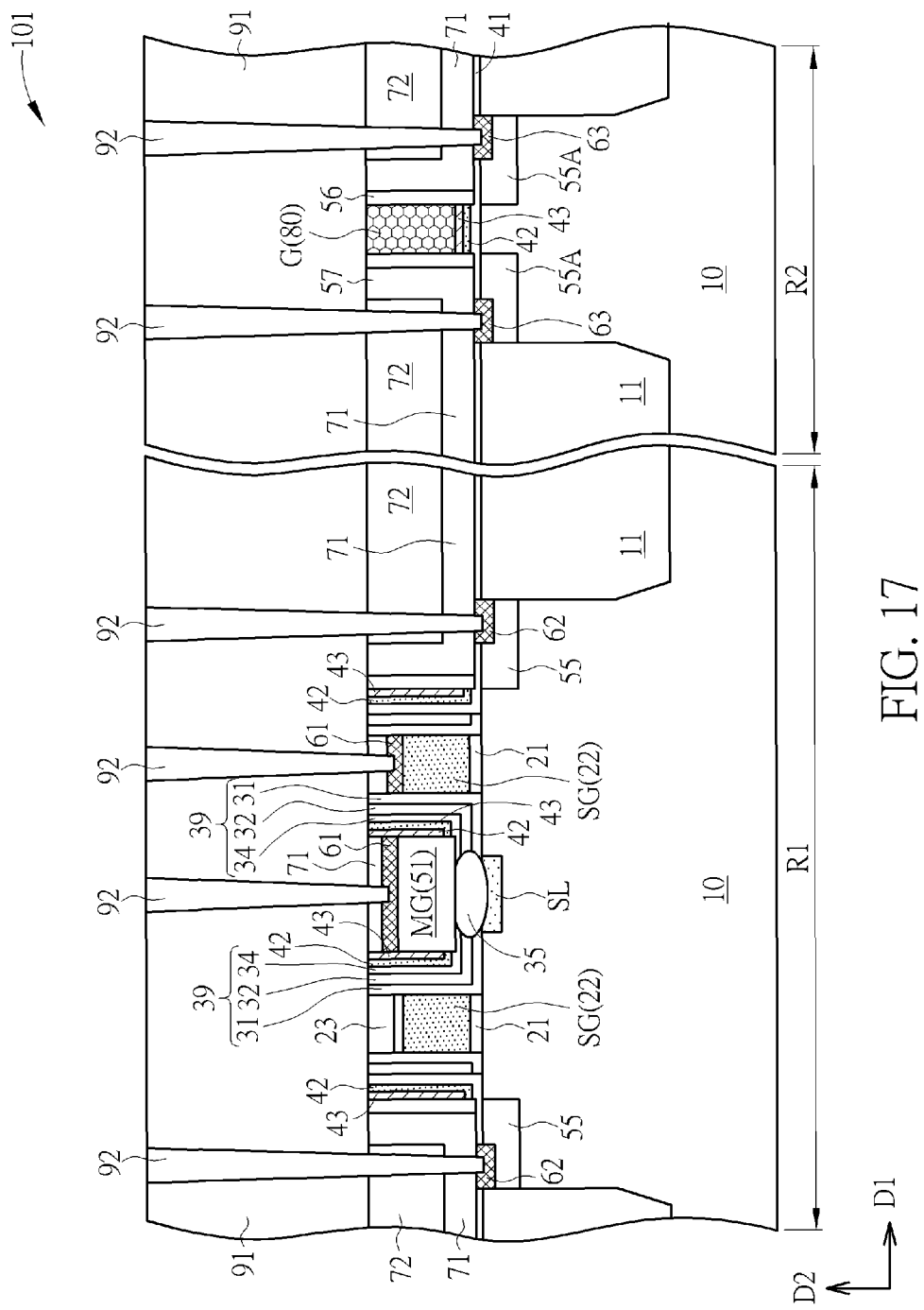

As shown in FIG. 15, an etching stop layer 71 and a first inter layer dielectric 72 are formed on the memory region R1 and the logic region R2 of the semiconductor substrate 10. A planarization process is then performed for exposing the dummy gate DG on the logic region R2. As shown in FIG. 15 and FIG. 16, the dummy gate DG on the logic region R2 is removed and replaced by a metal gate G. The method of removing the dummy gate DG on the logic region R2 and replacing the dummy gate DG by the metal gate G may include a replacement metal gate (RMG) process, but not limited thereto. The metal gate G may include a metal conductive material 80 and a corresponding work function layer (not shown). In this embodiment, the process may be regarded as a high-k first process because the high-k dielectric layer 42 is formed before the step of removing the dummy gate DG, but the present invention is not limited to this. In other embodiments of the present invention, the high-k last process may also be applied according to other considerations. As shown in FIG. 17, a second inter layer dielectric 91 is then formed to cover the memory region R1 and the logic region R2, and a plurality of contact plugs 92 are formed to penetrate the second inter layer dielectric 91 and other corresponding material layers for being electrically connected to the memory gate MG, the select gate SG, the drain regions 55, and the source/drain regions 55A respectively. A semiconductor device 101 shown in FIG. 17 may be obtained after the manufacturing method described above.

As shown in FIG. 17, the semiconductor device 101 in this embodiment includes the semiconductor substrate 10, a plurality of the select gates SG, two charge storage structures 39, the source region SL, the insulation block 35, and the memory gate MG. The semiconductor substrate 10 has the memory region R1. The select gates SG are disposed on the memory region R1 of the semiconductor substrate 10. The two charge storage structures 39 are disposed between two adjacent select gates SG. The source region SL is disposed in the semiconductor substrate 10 and between the two adjacent select gates SG. The insulation block 35 is disposed on the source region SL and between the two charge storage structures 39. The memory gate MG is disposed on the insulation block 39, and the memory gate MG is connected to the two charge storage structures 39. Each of the charge storage structures 39 includes the first oxide layer 31, the nitride layer 32, and the second oxide layer 34. The nitride layer 32 is disposed on the first oxide layer 31, and the second oxide layer 34 is disposed on the nitride layer 32. Additionally, the semiconductor device 101 may further include the high-k dielectric layer 42 and the barrier layer 43 disposed on the memory region R1 and the logic region R2 of the semiconductor substrate 10, and the barrier layer 43 is disposed on the high-k dielectric layer 42.

In the manufacturing method of this embodiment, a part of the high-k dielectric layer 42 and a part of the barrier layer 43 are disposed between the two adjacent select gates SG, and at least a part of the high-k dielectric layer 42 and at least a part of the barrier layer 43 are disposed between the memory gate MG and the charge storage structure 39, but the present invention is not limited to this. In other embodiments of the present invention, the high-k dielectric layer 42 and the barrier layer 43 between the two adjacent select gates SG may also be removed completely according to other considerations. In this embodiment, the memory gate MG and the select gates SG may be composed of polysilicon, and the semiconductor device 101 may further include the self-aligned silicide 61 disposed on the memory gate MG and at least one of the select gates SG in this situation for effectively forming an electrical connection with the corresponding contact plug 92. The material properties and technical features of each part in the semiconductor device 101 of this embodiment are described in the manufacturing method mentioned above and will not be redundantly described. It is worth noting that in the semiconductor device 101 in this embodiment, the purposes of shrinking the device size and enhancing the device integrity may be achieved because the memory gate MG and the source region SL are disposed corresponding to both the two charge storage structures 39 and the two select gates SG. In addition, the memory gate MG overlaps the source region SL in the vertical direction D2, and the insulation block 35 has to be disposed between the memory gate MG and the source region SL for insulating the memory gate MG from the source region SL accordingly. The insulation block 35 and the second oxide layer 34 of the charge storage structure 39 may be formed by an identical oxidation process for further simplifying the manufacturing process.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 18:
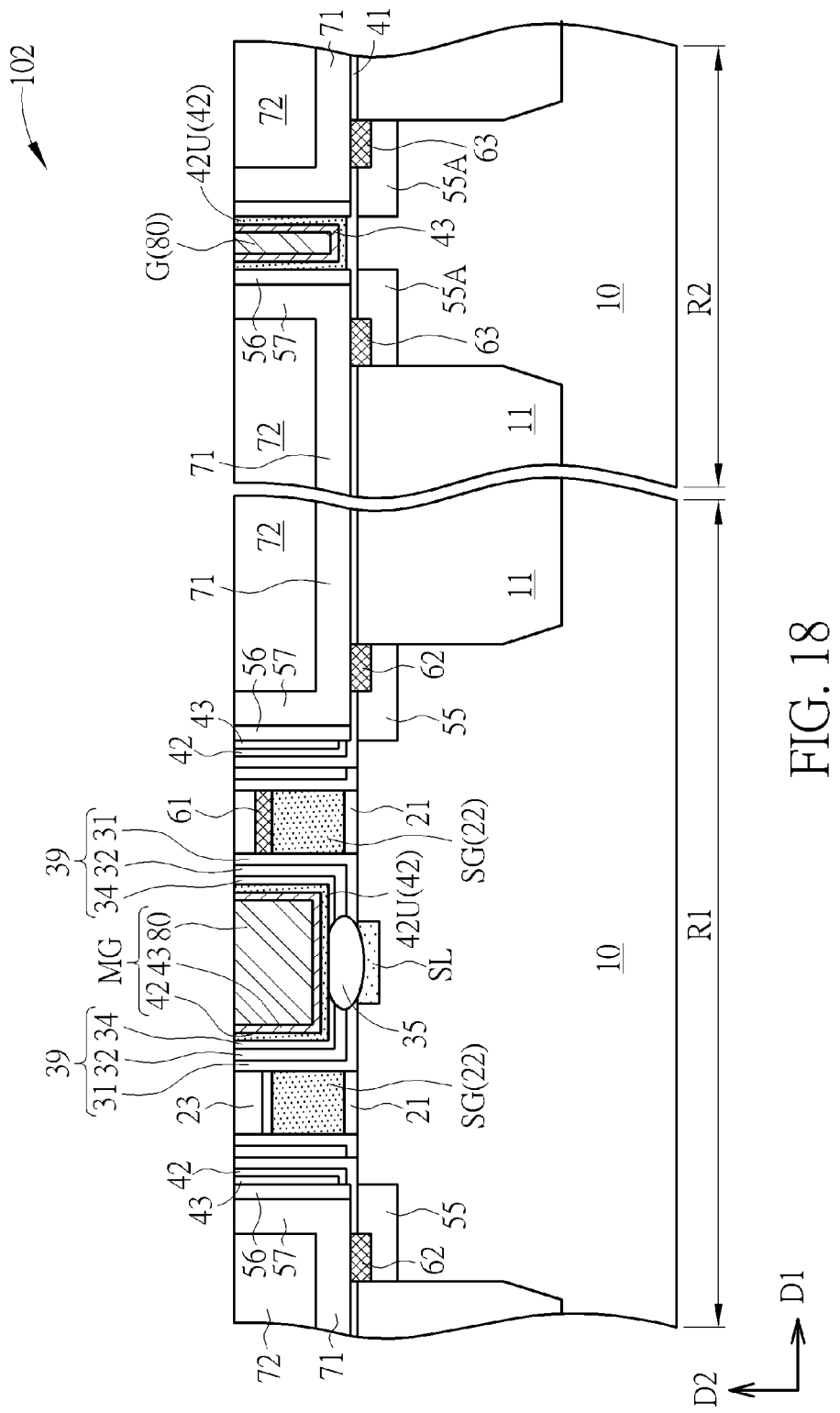
FIG. 18 is a schematic drawing illustrating a semiconductor device according to a second embodiment of the present invention.

Please refer to FIG. 18. FIG. 18 is a schematic drawing illustrating a semiconductor device 102 according to a second embodiment of the present invention. As shown in FIG. 18, the differences between the semiconductor device 102 of this embodiment and the semiconductor device of the first embodiment mentioned above is that in the manufacturing method of the semiconductor device 102, the high-k dielectric layer 42 and the barrier layer 43 are formed after the step of removing the dummy gate (not shown in FIG. 18), and this may be regarded as a high-k last process. Therefore, the high-k dielectric layer 42 on the logic region R2 and at least a part of the high-k dielectric layer 42 on the memory region R1 may include a U-shaped high-k structure 42U respectively. Additionally, in this embodiment, the memory gate MG and the metal gate G on the logic region R2 may be formed by the RMG process described above in the first embodiment, and the memory gate MG in this embodiment may also include the metal conductive material 80 accordingly. The metal conductive material 80 of the memory gate MG is surrounded by the U-shaped high-k structure 42U on the memory region R1, and the metal conductive material 80 of the metal gate G is surrounded by the U-shaped high-k structure 42U on the logic region R2.

Figure 19:
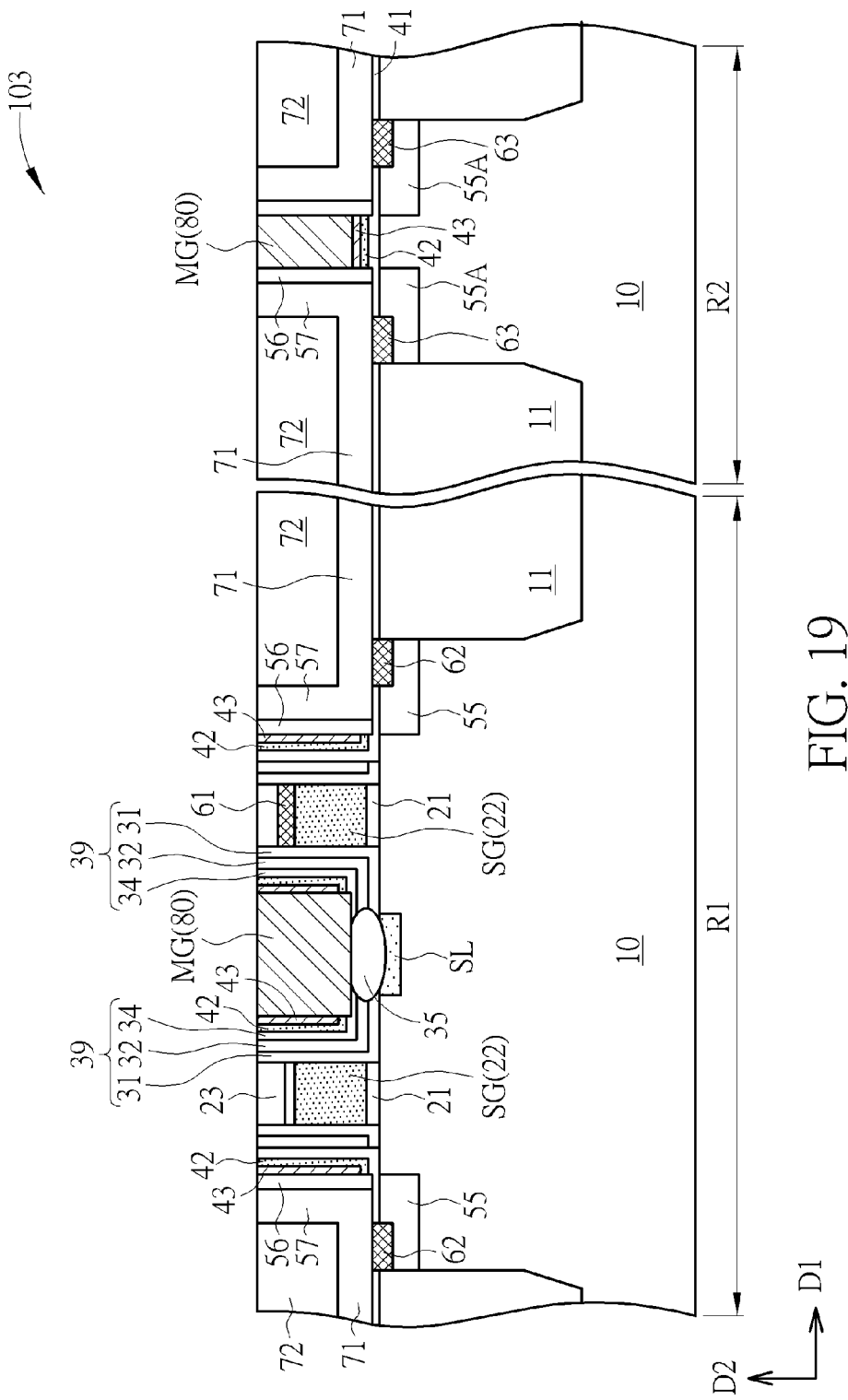
FIG. 19 is a schematic drawing illustrating a semiconductor device according to a third embodiment of the present invention.

Please refer to FIG. 19. FIG. 19 is a schematic drawing illustrating a semiconductor device 103 according to a third embodiment of the present invention. As shown in FIG. 19, the differences between the semiconductor device 103 of this embodiment and the semiconductor device of the second embodiment mentioned above is that the high-k dielectric layer 42 in this embodiment is formed before the step of removing the dummy gate (not shown in FIG. 19). The memory gate MG and the metal gate G on the logic region R2 may be formed by the RMG process described above in the first embodiment, and the memory gate MG in this embodiment may also include the metal conductive material 80 accordingly.

Figure 20:
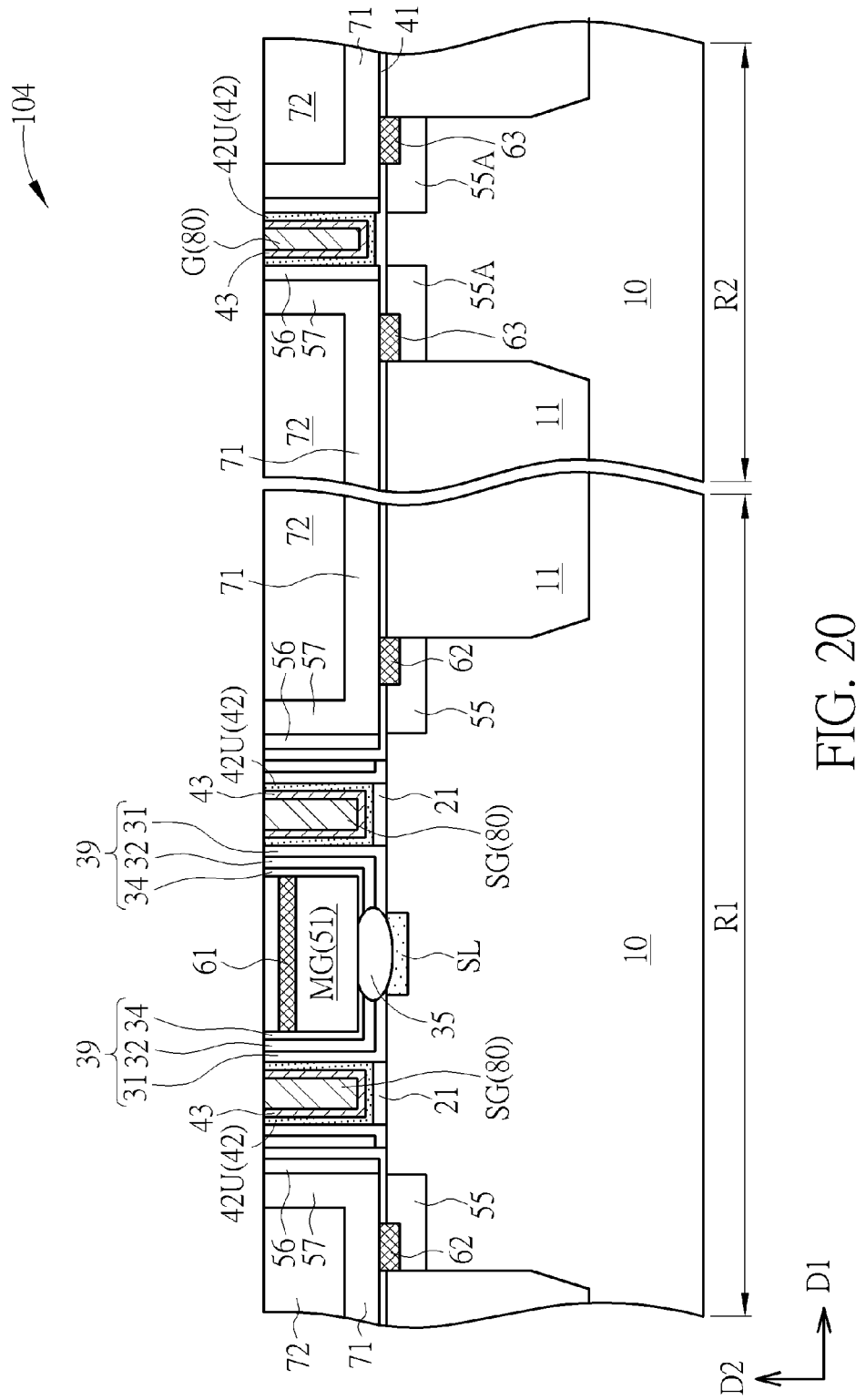
FIG. 20 is a schematic drawing illustrating a semiconductor device according to a fourth embodiment of the present invention.

Please refer to FIG. 20. FIG. 20 is a schematic drawing illustrating a semiconductor device 104 according to a fourth embodiment of the present invention. As shown in FIG. 20, the differences between the semiconductor device 104 of this embodiment and the semiconductor device of the second embodiment mentioned above is that the select gates SG and the metal gate G on the logic region R2 in this embodiment are formed by the RMG process described above in the first embodiment, the select gate SG includes the metal conductive material 80 accordingly, and the metal conductive material 80 of the select gate SG is surrounded by the U-shaped high-k structure 42U on the memory region R1. In other words, the select gate SG on the memory region R1 of the semiconductor device in this embodiment may also include a metal gate structure. The problems, which might occur when the select gate SG is formed by polysilicon material, such as the depletion effect and/or the tunneling effect, may be avoided accordingly, and it is helpful for shrinking the size of the memory device.

Figure 21:
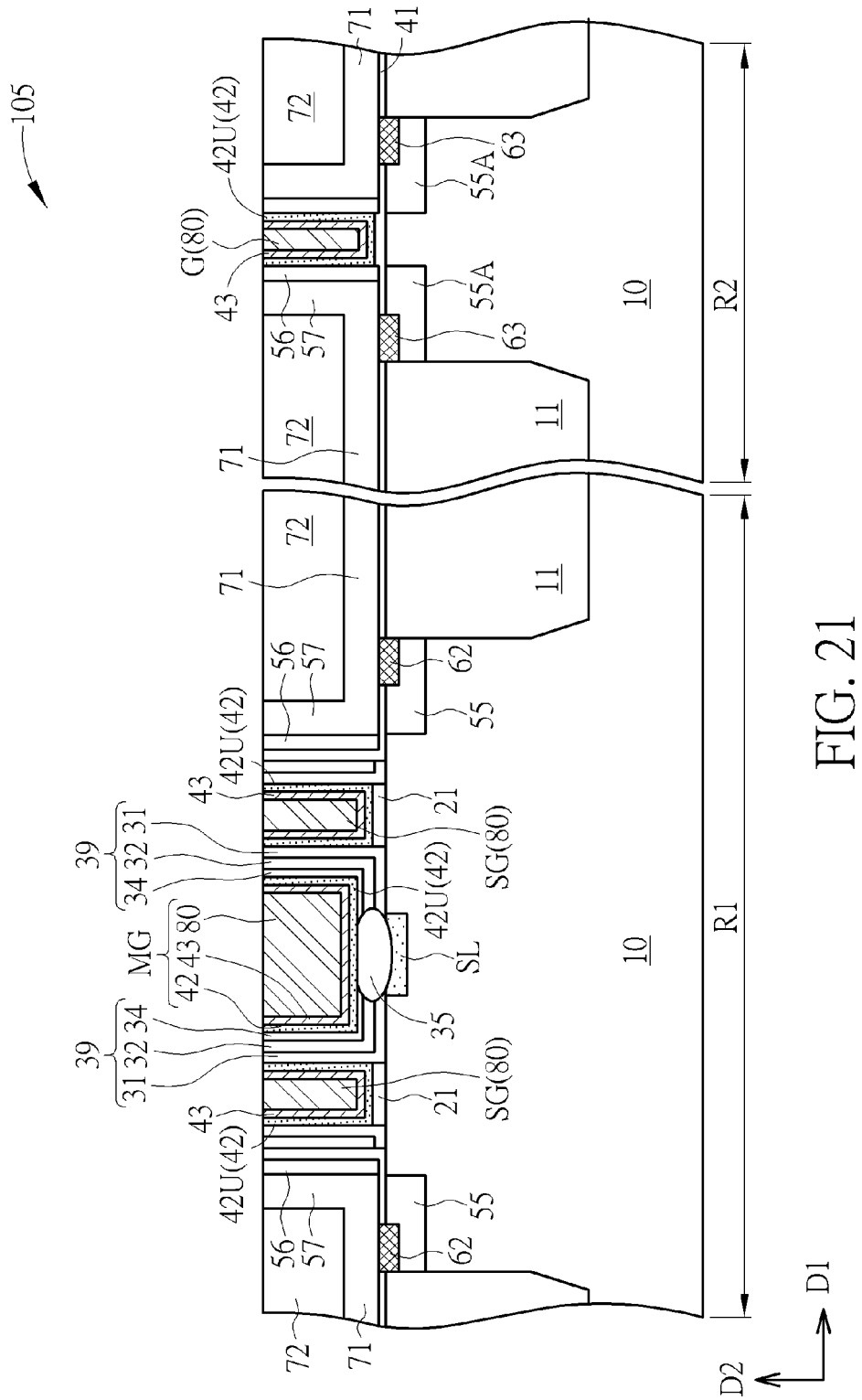
FIG. 21 is a schematic drawing illustrating a semiconductor device according to a fifth embodiment of the present invention.

Please refer to FIG. 21. FIG. 21 is a schematic drawing illustrating a semiconductor device 105 according to a fifth embodiment of the present invention. As shown in FIG. 21, the differences between the semiconductor device 105 of this embodiment and the semiconductor device of the fourth embodiment mentioned above is that the memory gate MG, the select gates SG, and the metal gate G on the logic region R2 may all be formed by the RMG process described above in the first embodiment. The memory gate MG and the select gate SG may include the metal conductive material 80 respectively. The metal conductive material 80 of the memory gate MG and the metal conductive material 80 of the select gate SG may also be surrounded by the U-shaped high-k structure 42U on the memory region R1 respectively.

Figure 22:
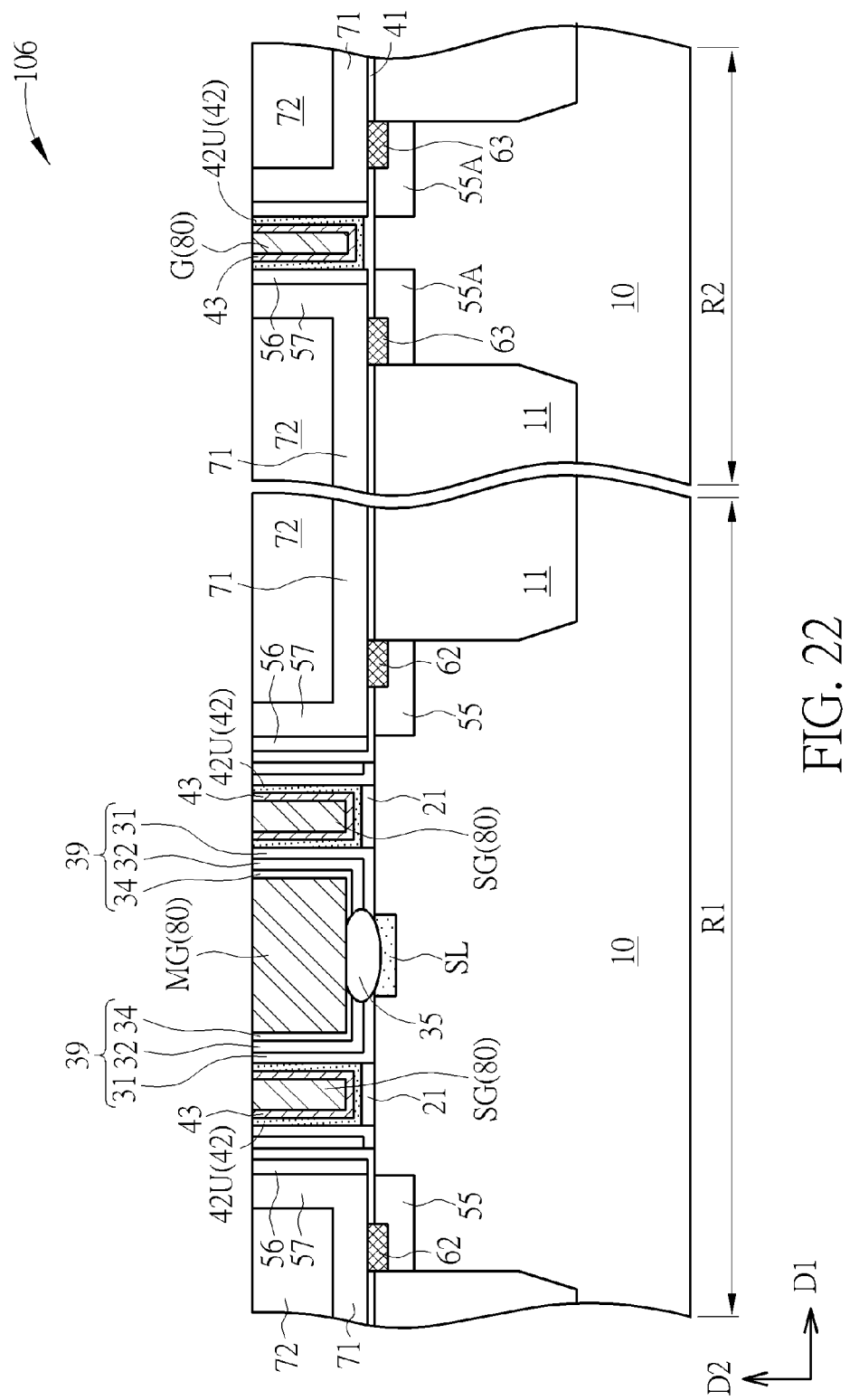
FIG. 22 is a schematic drawing illustrating a semiconductor device according to a sixth embodiment of the present invention.

Please refer to FIG. 22. FIG. 22 is a schematic drawing illustrating a semiconductor device 106 according to a sixth embodiment of the present invention. As shown in FIG. 22, the differences between the semiconductor device 106 of this embodiment and the semiconductor device of the fifth embodiment mentioned above is that there may be no high-k dielectric layer 42 and no barrier layer 43 formed between the two charge storage structures 39, and the memory gate MG may directly contact the corresponding two charge storage structures 39.

To summarize the above descriptions, in the semiconductor device and the manufacturing method thereof in the present invention, the memory gate is disposed overlapping the source region, the memory gate and the source region are electrically insulated from each other, and the memory is connected to two charge storage structures at the same time for achieving the purposes of shrinking the device size and enhancing the device integrity. Additionally, the second oxide layer in the charge storage structure and the insulation block configured to insulate the memory gate from the source region may be formed by an identical oxidation process for further simplifying the manufacturing process. In the present invention, the memory gate and/or the select gate on the memory region may also be formed by the RMG process of forming the metal gate on the logic region, and the purposes of process simplification and device performance enhancement may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
    forming a plurality of select gates on a memory region of a semiconductor substrate;
    forming two charge storage structures between two adjacent select gates;
    forming a source region in the semiconductor substrate, wherein the source region is formed between the two adjacent select gates;
    forming an insulation block on the source region, wherein the insulation block is formed between the two charge storage structures; and
    forming a memory gate on the insulation block, wherein the memory gate is connected to the two charge storage structures, wherein each of the charge storage structures comprises:
        a first oxide layer;
        a nitride layer formed on the first oxide layer; and
        a second oxide layer formed on the nitride layer, wherein the second oxide layer and the insulation block are formed by an identical oxidation process, and the source region is formed after the step of forming the first oxide layer and the step of forming the nitride layer and formed before the step of forming the second oxide layer.

2. The manufacturing method of claim 1, further comprising:
    forming a dummy gate on a logic region of the semiconductor substrate.

3. The manufacturing method of claim 2, wherein the dummy gate and the memory gate are formed by a polysilicon layer.

4. The manufacturing method of claim 3, further comprising:
    performing a recessing process on the memory gate; and
    forming a self-aligned silicide (salicide) on the memory gate after the recessing process.

5. The manufacturing method of claim 2, further comprising:
    removing the dummy gate on the logic region and replacing the dummy gate by a metal gate, wherein the method of removing the dummy gate on the logic region and replacing the dummy gate by the metal gate comprises a replacement metal gate (RMG) process.

6. The manufacturing method of claim 5, further comprising:
    forming a high-k dielectric layer on the memory region and the logic region of the semiconductor substrate; and
    forming a barrier layer on the high-k dielectric layer, wherein a part of the high-k dielectric layer and a part of the barrier layer are located between the two adjacent select gates.

7. The manufacturing method of claim 6, wherein the high-k dielectric layer is formed before the step of removing the dummy gate.

8. The manufacturing method of claim 6, wherein the high-k dielectric layer and the barrier layer are formed after the step of removing the dummy gate.

9. The manufacturing method of claim 6, wherein at least a part of the high-k dielectric layer and at least a part of the barrier layer are located between the memory gate and the charge storage structure.

10. The manufacturing method of claim 5, wherein the memory gate and the metal gate on the logic region are formed by the RMG process, and the memory gate comprises a metal conductive material.

11. The manufacturing method of claim 5, wherein the select gate and the metal gate on the logic region are formed by the RMG process, and the select gate comprises a metal conductive material.

* * * * *